United States Patent [19]
Zitta

[11] Patent Number: 5,289,051
[45] Date of Patent: Feb. 22, 1994

[54] POWER MOSFET DRIVER HAVING AUXILIARY CURRENT SOURCE

[75] Inventor: Heinz Zitta, Drobollach, Austria

[73] Assignee: Siemens Aktiengesellschaft, Munich, Fed. Rep. of Germany

[21] Appl. No.: 950,195

[22] Filed: Sep. 24, 1992

[30] Foreign Application Priority Data

Sep. 24, 1991 [DE] Fed. Rep. of Germany ....... 4131783

[51] Int. Cl.⁵ .................. H03K 3/01; H03K 5/12
[52] U.S. Cl. ................... 307/270; 307/263; 307/264; 307/572; 307/576
[58] Field of Search .................. 307/262–264, 307/270, 572, 576, 645

[56] References Cited

U.S. PATENT DOCUMENTS 4,677,324  6/1987  Ronan, Jr. et al. ............. 307/571
4,818,901  4/1989  Young et al. .................... 307/263

FOREIGN PATENT DOCUMENTS 0067552  6/1977  Japan .......................... 307/263

Primary Examiner—Margaret R. Wambach
Attorney, Agent, or Firm—Herbert L. Lerner; Laurence A. Greenberg

[57] ABSTRACT

An assembly has an MOS power transistor with an output circuit and an input circuit, a load connected in series with the output circuit of the MOS power transistor, and a control stage for controlling the input circuit of the MOS power transistor. A circuit configuration for triggering the MOS power transistor includes a constant current source and a switchable auxiliary current source connected parallel to the constant current source for feeding the control stage. The auxiliary current source is turned off at a predetermined period of time after an onset of a control event for the MOS power transistor.

9 Claims, 1 Drawing Sheet

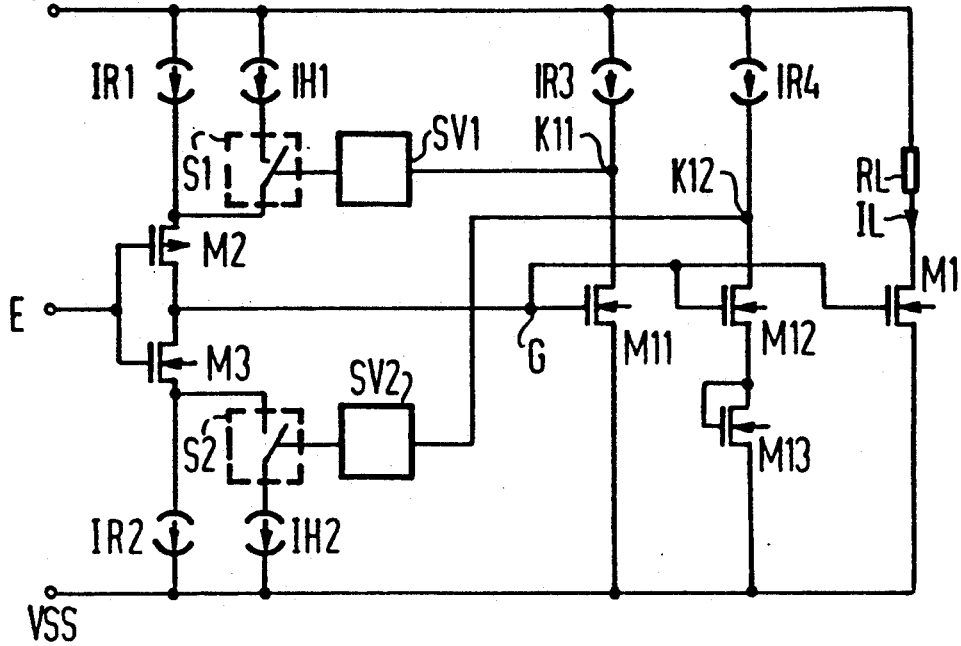
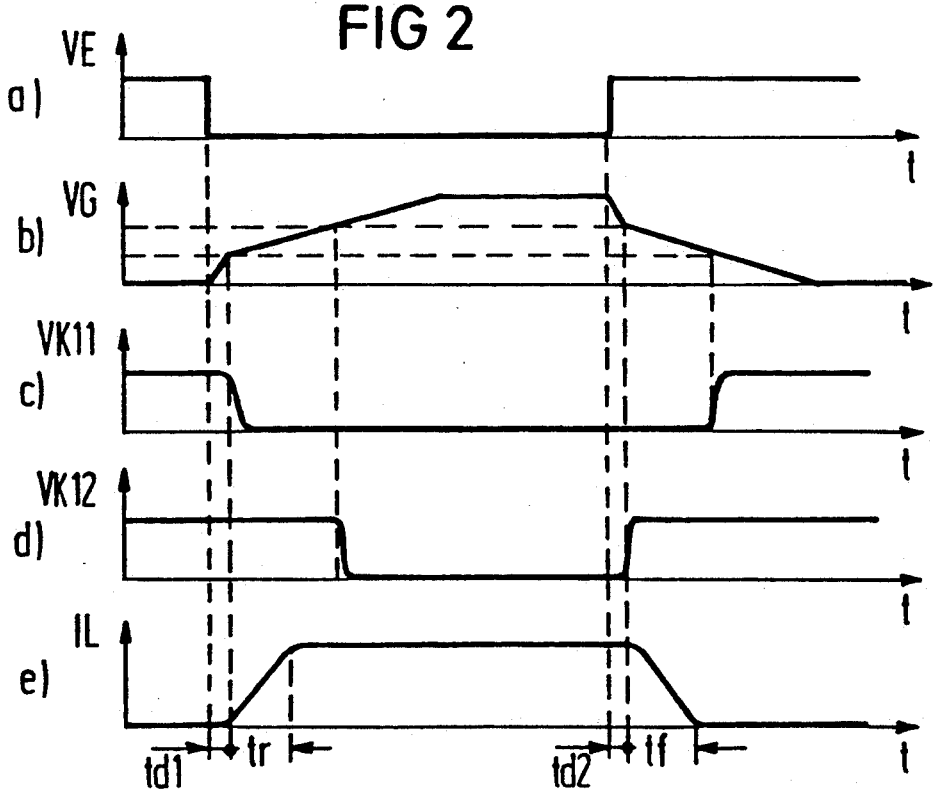

POWER MOSFET DRIVER HAVING AUXILIARY CURRENT SOURCE

The invention relates to a circuit configuration for triggering an MOS power transistor having an output circuit in series with a load and an input circuit controlled by a control stage.

Triggering of power transistors, which are preferably used as switches, is described in the book by Ulrich Tietze and Christoph Schenk entitled: "Halbleiter-Schaltungstechnik [Semiconductor Circuitry], Springer Publishers, 7th Edition, 1985, p. 554 ff. It is emphasized that MOS power transistors have major advantages when used as power switches because type II channeling occurs and there is no storage time. However, such power transistors cannot be controlled in a power-free manner, because they have parasitic gate-to-drain and gate-to-source capacitors. In a switching or control event for a power transistor, a discharge of such parasitic capacitors is therefore necessary each time, and it must be provided by a control stage. A fast control event therefore requires a low-impedance driver or a low-impedance control stage. The control stage may be a complementary emitter follower or a complementary source follower or inverter.

Particularly when the currents to be switched are high, in the ampere range, disturbing or interfering radiation results from the steep switching edges in MOS power transistors, which can lead to problems in electromagnetic compatibility, particularly with integrated circuits. The same is true for an integrated MOS power switch of the SMART power type. Such power switches are used to switch ohmic and/or inductive load or consumers, and are preferably used in motor vehicles. Aside from the unacceptable high-frequency disturbances that may be caused by the steep switching edges of the load current, it must be expected that in the future, regulations regarding radiation from power transistors will be even more stringent.

One possible way to avoid disturbing or interfering radiation in switching the power transistor is to turn the power transistor on and off more slowly. That can be done with high-impedance drivers, for instance. In that case, however, the advantage of MOS power transistors, which can be turned on and off faster than bipolar power transistors, is lost. A capacitor connected parallel to the input circuit of the MOS power transistor has the same effect. Since in a control event, in other words when the power transistor is turned on and off, its gate capacitor must be charged or discharged, an additional capacitor makes this event slower. The total switching delay of the power transistor is composed not only of the delay time necessary for reversing the charge of the input capacitors but also the rise and fall times. Although an additional capacitor in the input circuit of the power transistor does prolong the rise or fall time, primarily it lengthens the delay time for reversing the charge of the capacitors. Yet lengthening the delay time is undesirable, since for the disturbing or interfering radiation, it is only the operative switching edge, in other words essentially the rise or fall time, that is decisive.

It is known that viewed from the input, the parasitic Miller capacitor of a transistor acts like a capacitor which is parallel to the transistor input. The feedback effect during the switching event has an advantageous effect on the ratio between the delay time and the edge steepness, or in other words the rise or fall time. Another option for reducing the disturbing or interfering radiation is therefore to incorporate an additional Miller capacitor between the drain and the gate of the MOS power transistor. However, in integrated circuits, incorporating an additional capacitor requires considerable surface area, so that such a provision appears disadvantageous.

It is accordingly an object of the invention to provide a circuit configuration for triggering an MOS power transistor, which overcomes the hereinafore-mentioned disadvantages of the heretofore-known devices of this general type and to disclose a trigger circuit for an MOS power transistor that enables minimizing the disturbing or interfering radiation in a switching or control event of the MOS transistor, without substantially prolonging the turn-on or turn-off delay of the power transistor.

With the foregoing and other objects in view there is provided, in accordance with the invention, in an assembly having an MOS power transistor with an output circuit and an input circuit, a load connected in series with the output circuit of the MOS power transistor, and a control stage for controlling the input circuit of the MOS power transistor, a circuit configuration for triggering the MOS power transistor, comprising a constant current source and a switchable auxiliary current source connected parallel to the constant current source for feeding the control stage, the auxiliary current source being turned off at a predetermined period of time after an onset of a control event for the MOS power transistor.

An advantage of the invention is that it substantially alone makes it possible to reduce the rise or fall time in a control event of the power transistor in such a way as to permit the allowable disturbing or interfering radiation, without substantially prolonging the undesired delay times for reversing the charge of the parasitic input capacitors of the power transistor. In a control event of the power transistor, it is possible to optimize the rise and fall times separately with a view to the allowable disturbing or interfering radiation.

In accordance with another feature of the invention, there is provided a switch for switching the auxiliary current source, and a further switch being controlled by the control stage for actuating the switch.

In accordance with a further feature of the invention, the further switch is a switching transistor having an input circuit connected parallel to the input circuit of the MOS power transistor.

In accordance with an added feature of the invention, the further switch has a switching threshold being tuned substantially to parasitic reverse-charging effects of the input circuit of the MOS power transistor upon a control event.

In accordance with an additional feature of the invention, there is provided another auxiliary current source, each of the switchable auxiliary current sources controlling a respective one of turn-on and turn-off control events of the MOS power transistor.

In accordance with yet another feature of the invention, the switching transistor has a switching threshold being active upon a turn-off control event of the MOS power transistor and being higher than a switching threshold of the MOS power transistor.

In accordance with yet a further feature of the invention, the switching transistor and the MOS power transistor are substantially identically, current mirror transistors.

In accordance with yet an added feature of the invention, the auxiliary current source has a current being substantially higher than the current of the constant current source.

In accordance with a concomitant feature of the invention, there is provided a switch configuration with a predeterminable switching threshold being connected between the further switch and the switch.

Other features which are considered as characteristic for the invention are set forth in the appended claims.

Although the invention is illustrated and described herein as embodied in a circuit configuration for triggering an MOS power transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a basic schematic circuit diagram of a configuration according to the invention; and FIG. 2 is a signal diagram used to explain the operation of the circuit of FIG. 1.

Referring now to the figures of the drawing in detail and first, particularly, to FIG. 1 thereof, there is seen a circuit configuration according to the invention which includes a power transistor M1, having an output circuit which is connected in series with a load RL and having an input circuit, or in other words having a gate, which is controlled by a control stage including transistors M2 and M3. The control or driver stage includes complementary elements in the form of the transistor M2 which is a p-channel transistor and the transistor M3 which is an n-channel transistor. Both of the transistors are connected as inverters. Jointly connected gates of the transistor M2 and the transistor M3 are connected to a terminal E for receiving the control signals. A connection point between output circuits of the transistor M2 and the transistor M3 is connected to the gate of the transistor M1. Respective constant current sources IR1 and IR2 are connected between respective terminals on the source side of the transistors M2 and M3 and respective poles of a supply voltage terminal VDD or VSS. An auxiliary current source IH1, having a current that can be fed through a switch S1 to the source of the transistor M2, is connected parallel to the current source IR1 on the source side of the transistor M2. Correspondingly, an auxiliary current source IH2, having a current that can be fed to the source of the transistor M3 through a switch S2, is connected parallel to the current source IR2 on the source side of the transistor M3.

Two transistors M11 and M12 are connected parallel to the power transistor M1 on the input side. Respective gate terminals of the two transistors M11 and M12, like the gate terminal of the transistor M1, are connected through a gate node G to the output of the control stage which includes the transistors M2 and M3. The drain sides of the transistors M11 and M12 are supplied through respective current sources IR3 and IR4, which in turn are connected to the terminal VDD. The source side of the transistor M11 is directly connected to the terminal VSS, while the source side of the transistor M12 is connected to the terminal VSS through a transistor M13 which is connected as a diode. A connection point K11 connecting the drain of the transistor M11 to the current source IR3 is connected to a switch configuration SV1, which controls the switch S1. Correspondingly, a connection point K12 interconnecting the drain of the transistor M12 and the current source IR4 is connected to a switch configuration SV2, which controls the switch S2. Each of the switch configurations SV1 or SV2 may be constructed as a simple inverter. To that end two complementary transistors are preferably connected to one another in a manner corresponding to that for the transistors M2 and M3, and the output circuits thereof are respectively supplied by the terminals VDD and VSS of the supply voltage source. Instead of an inverter, the respective switch configurations SV1 and SV2 may each be constructed as a comparator. Each comparator preferably has suitable reference voltages at an input. For example, the switch configuration SV1 may be connected as a non-inverting comparator, while the switch configuration SV2 may be constructed as an inverting comparator, in terms of the respective connection points or nodes K11 and K12. The outputs of the respective inverters or comparators then control the respective switches S1 and S2. Typically, the switches S1 and S2 are transistors, wherein the switch S1 may be a p-channel transistor while the switch S2 is an n-channel transistor.

The function of the circuit of FIG. 1 will be described below. In the off state of the power transistor M1, the input terminal E of the control stage is at logically high potential. This means that the transistor M2 is blocked while the transistor M3 is conducting. The gate of the power transistor M1 is discharged, and the parallel-connected transistors M11 and M12 on the input side are blocked. Correspondingly, the node K11 is at logically high potential and with the aid of the switch configuration SV1 is used to close the switch S1. This is the case, for instance, if the switch configuration SV1 is constructed as an inverter and the switch S1 is constructed as a p-channel transistor. Correspondingly, the node K12 is likewise at high potential and with the aid of the switch configuration SV2, it serves to open the switch S2. This condition is met if the switch configuration SV2 is constructed as an inverter and the switch S2 as an n-channel transistor.

At the onset of a turn-on event, a potential VE at the terminal E is applied to logical 0, as is seen in a part b) of FIG. 2. The transistor M2 becomes conducting while the transistor M3 is blocked. Since the switch S1 is closed, the currents of the constant current source IR1 and the auxiliary current source IH1 charge the gate or gate-to-source capacitor of the power transistor M1. The substantially smaller capacitors of the transistors M11 and M12 are charged as well. A potential VG at the gate node G, as is seen in part b) of FIG. 2, rises as a result. As soon as the potential VG reaches the operating voltage of the transistor M11, this transistor becomes conducting, and a potential VK11 at the node K11 becomes logical 0, as is seen in a part c) of FIG. 2. The switch S1 is correspondingly opened by the switch configuration SV1, so that the auxiliary current source IH1 can feed no further current into the control stage. The control stage is therefore then supplied only by the constant current source IR1.

The dimensioning of the current sources IR1 and IH2 and of the operating voltages of the transistors is carried out in such a way that the requisite delay time substantially for reversing the charge of the gate capacitors becomes short, and no perturbing radiation occurs in the actual rise time of the switching edge. Ideally, the current of the auxiliary current source IH1 is therefore substantially higher than that of the constant current source IR1. The operating voltage or switching threshold of the transistor M11, which should be considered as a further switch, is substantially tuned to the parasitic reverse-charging effects of the MOS power transistor. Correspondingly, the addition of the two currents furnished by the current sources IR1 and IH1 cooperate in reversing the charge of the gate capacitors during a delay time td1. The current source IR1 for charging the gate of the transistor M1 also contributes only to the turn-off of the auxiliary current source IH1. The current source IR1 is dimensioned in such a way that during a rise time tr of a load current IL flowing through the power transistor M1, no disturbing or interfering radiation or only allowable disturbing or interfering radiation is emitted, as is seen in a part e) of FIG. 2.

As can be seen from part b) through part d) of FIG. 2, the operating voltage of the transistor M12 is at a higher level than the operating voltage of the transistor M11. Accordingly, the transistor M12 becomes conducting at a gate potential VG that is higher as compared with that of the transistor M11, and as a result, a potential VK12 at the node K12 becomes logical 0. In the exemplary embodiment of FIG. 1, the higher operating voltage of the transistor M12 is attained by means of the transistor M13 that is connected as a diode. Since the only essential matter for the function of the circuit is for the switching threshold of a further switch which is constructed as the transistor M12 to be above the switching threshold of the transistors M1 and M11, it is also possible to provide suitable dimensioning of the transistor M12 and of the current source IR4, or to provide a transistor M12 with a higher operating voltage, instead of the transistor M13. The operating voltage of the transistor M1 preferably corresponds to the operating voltage of the transistor M11 as is seen in FIG. 2.

As soon as the transistor M12 has become conducting, the node K12 is at a logically lower potential, so that the circuit configuration SV2 closes the switch S2. The turn-on event is thus concluded.

During the turn-off event, the potential VE of the terminal E becomes logical 1. Correspondingly, the transistor M2 opens and the transistor M3 closes. Thus, as is shown in part b) of FIG. 2, the potential VG at the node G initially drops. Since the switch S2 is closed, both the constant current source IR2 and the auxiliary current source IH2 are actively involved in the discharge of the gate capacitors. The current source IH2 preferably furnishes a substantially higher current than the current source IR2. Correspondingly, the gate capacitors can be discharged relatively fast, so that the delay time remains short.

When the operating voltage of the transistor M12 is reached, this transistor blocks, so that the potential of the node K12 becomes logical 0, and the switch S2 is opened by the switch configuration SV2. Thus, only the current of the constant current source IR2 remains available for further discharge of the gate of the transistor M1. This current is selected in such a way that during a fall time tf, no disturbing or interfering radiation, or only the allowable disturbing or interfering radiation, occurs. Once they reach their respective operating voltages, the transistors M1 and M11 block. This makes the load RL current-free and makes the load current IL=0. The node K11 also assumes a logically high potential, so that switch S1 is closed by the switch configuration SV1. A delay time td2 can remain short overall, while the fall time tf substantially does not lead to the emission of disturbing or interfering radiation.

The transistors M1, M11 and M12 can preferably be constructed identically, in the manner or on the principle of a current mirror, so that the surface areas of the transistors M11 and M12 are very much smaller than the surface area of the transistor M1. If this current mirror principle is used, the function of the circuit becomes independent of temperature and production fluctuations in the transistors M1, M11 and M12.

It is immediately apparent that the circuit configuration according to the invention may in the same way include p-channel switching transistors instead of n-channel switching transistors. The gate control voltage may likewise be generated by a charge pump, so that the circuit configuration can be used for any known MOS power technology, and in particular for low-side and high-side switches, or in other words power switches that, as in FIG. 1, are disposed between the load and the negative pole of the supply voltage source or between the load and the positive pole of the supply voltage source, respectively.

I claim:

1. In an assembly having an MOS power transistor with an output circuit and an input circuit, a load connected in series with the output circuit of the MOS power transistor, and a control stage for controlling the input circuit of the MOS power transistor, a circuit configuration for triggering the MOS power transistor, comprising:
    a constant current source and a switchable auxiliary current source connected parallel to said constant current source for feeding the control stage, said auxiliary current source being turned off at a predetermined period of time after an onset of a control event for the MOS power transistor.

2. The configuration according to claim 1, including a switch for switching said auxiliary current source, and a further switch being controlled by the control stage for actuating said switch.

3. The configuration according to claim 2, wherein said further switch is a switching transistor having an input circuit connected parallel to the input circuit of the MOS power transistor.

4. The configuration according to claim 2, wherein said further switch has a switching threshold being tuned substantially to parasitic reverse-charging effects of the input circuit of the MOS power transistor upon a control event.

5. The configuration according to claim 1, including another auxiliary current source, each of said switchable auxiliary current sources controlling a respective one of turn-on and turn-off control events of the MOS power transistor.

6. The configuration according to claim 3, wherein said switching transistor has a switching threshold being active upon a turn-off control event of the MOS power transistor and being higher than a switching threshold of the MOS power transistor.

7. The configuration according to claim 3, wherein said switching transistor and the MOS power transistor are substantially identically, current mirror transistors.

8. The configuration according to claim 1, wherein said auxiliary current source has a current being substantially higher than the current of said constant current source.

9. The configuration according to claim 2, including a switch configuration with a predeterminable switching threshold being connected between said further switch and said switch.

* * * * *